(12) United States Patent
Le

(10) Patent No.: US 6,278,292 B1
(45) Date of Patent: Aug. 21, 2001

(54) INTERGRATED CIRCUIT

(75) Inventor: Thoai-Thai Le, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/401,022

(22) Filed: Sep. 21, 1999

(30) Foreign Application Priority Data

Sep. 21, 1998 (DE) ............................................ 198 43 159

(51) Int. Cl.$^7$ .................................................. H01L 25/00
(52) U.S. Cl. ................. 326/47; 326/82; 326/105
(58) Field of Search .................... 327/258, 259, 327/291, 295; 326/56, 105, 82, 47

(56) References Cited

U.S. PATENT DOCUMENTS 5,724,287 * 3/1998 Takenaka ............................ 365/191

FOREIGN PATENT DOCUMENTS

3711604A1   10/1987 (DE) .
0 223 275 A1   5/1987 (EP) .
WO 92/09140   5/1992 (WO) .

OTHER PUBLICATIONS

Patent Abstracts of Japan No. 06310999 (Yasuo), dated Nov. 4, 1994.

Patent Abstracts of Japan No. 4–213914(A) (Mori), dated Aug. 5, 1992.

* cited by examiner

Primary Examiner—Michael Tokar
Assistant Examiner—Anh Tran
(74) Attorney, Agent, or Firm—Herbert L. Lerner; Laurence A. Greenberg; Werner H. Stemer

(57) ABSTRACT

The integrated circuit has a first logic unit, a second logic unit and a delay unit. The first logic unit is connected to the second logic unit via signal lines. Inputs of the delay unit are connected to a respective one of the signal lines. An output of the delay unit is connected to an activation input of the second logic unit. The delay unit activates the second logic unit only after a delay with respect to level changes occurring at its inputs.

1 Claim, 3 Drawing Sheets

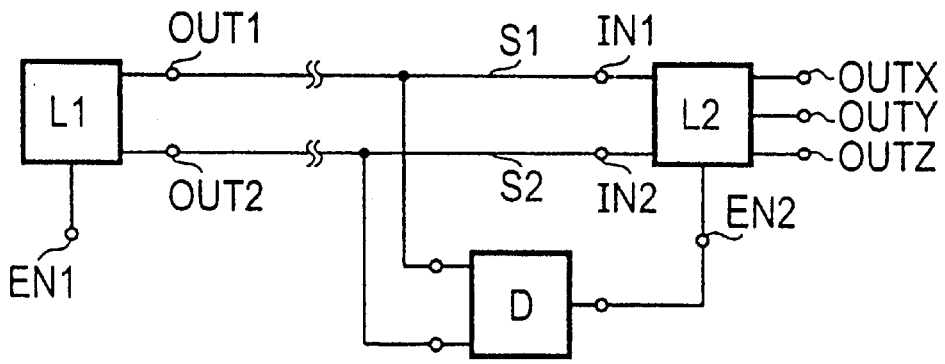
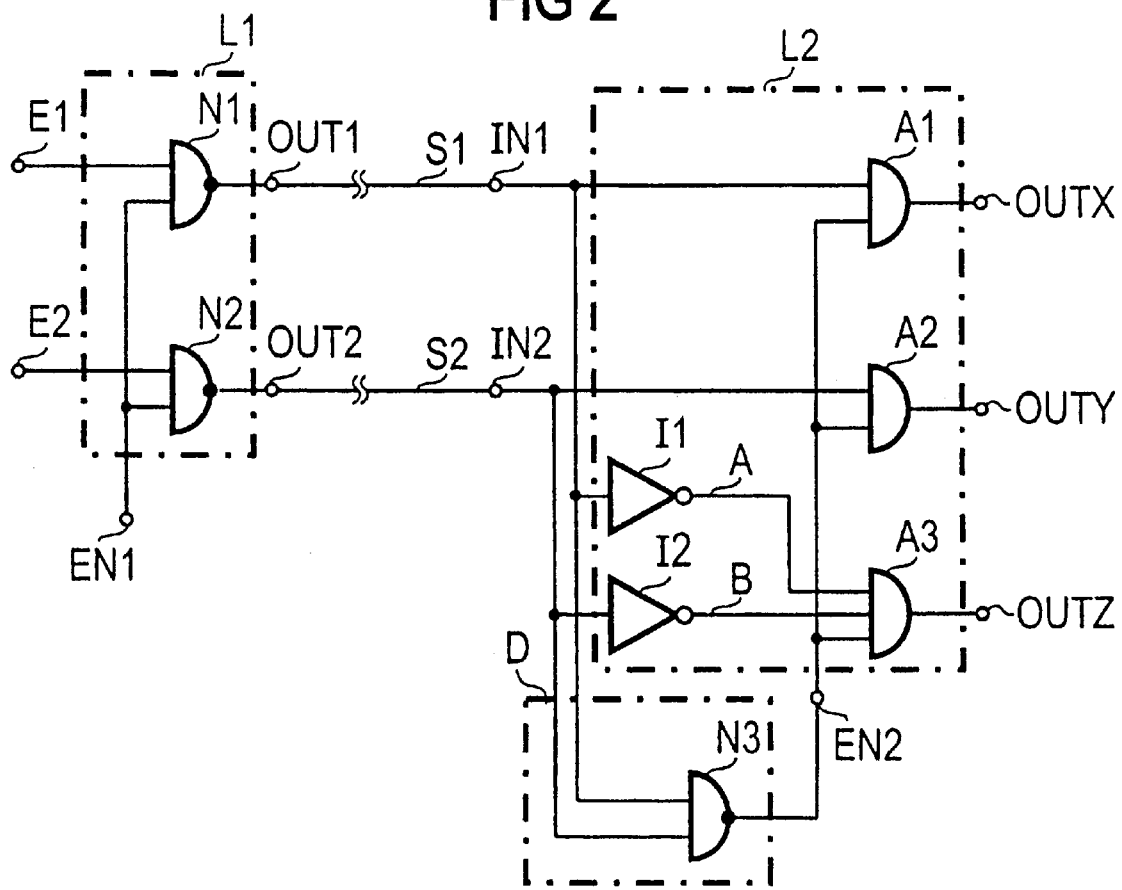

INTERGRATED CIRCUIT

BACKGROUND OF THE INVENTION

Field of the Invention

The invention relates to an integrated circuit having a first logic unit with an activation input and with two outputs, which are connected to a respective input of a second logic unit via a respective signal line. The first logic unit outputs a first potential level at both outputs in the deactivated state and a second potential level on at least one of the outputs in the activated state. The second logic unit has at least two outputs, at which it generates potential changes depending on potential changes at its inputs.

SUMMARY OF THE INVENTION

The invention is based on the object of specifying an integrated circuit of the aforementioned type in which level changes at a plurality of the outputs of its second logic unit, which are triggered by level changes at the inputs of the second logic unit, take place simultaneously even if the signal propagation times on the two signal lines between the outputs of the first logic unit and the inputs of the second logic unit differ from one another.

With these objects in view there is provided, in accordance with the invention, an integrated circuit, comprising:
  a first logic unit having an activation input and two outputs;
  a second logic unit having an activation input and having two inputs each connected to a respective one of the outputs of the first logic unit via a respective signal line;
  the first logic unit outputting a first potential level at the two outputs in a deactivated state and a second potential level on at least one of the two outputs in an activated state thereof;
  a delay unit having two inputs each connected to a respective one of the signal lines and an output connected to the activation input of the second logic unit;
  the second logic unit having at least two outputs generating, upon being activated, a level change on account of a level change at one of the two inputs;
  the delay unit deactivating the second logic unit via the output when the first potential level is present at the two inputs, and activating the second logic unit when the second potential level is present at one of the two inputs; and
  the delay unit triggering a temporally delayed level change at the output on account of a level change at one of the inputs with a delay at least as long as a difference between respective signal propagation times on the two signal lines between the outputs of the first logic unit and the inputs of the second logic unit.

In accordance with a concomitant feature of the invention, each of the inputs of the delay unit is connected to a respective one of the signal lines at a point significantly nearer to the inputs of the second logic unit than to the outputs of the first logic unit. The spacing is easily maximized by placing the taps in vicinity to the inputs of the second logic unit, so that any propagation delay from the taps to the inputs is negligible or essentially non-existent. In this way, the circuit properly compensates for the differences in the propagation delay in the signal lines connecting the first and second logic units.

Other features which are considered as characteristic for the invention are set forth in the appended claims.

Although the invention is illustrated and described herein as embodied in an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block diagram of an exemplary embodiment of the integrated circuit;

FIG. 2 is a detailed circuit schematic relating to the exemplary embodiment of FIG. 1;

DESCRIPTION OF THE PREFERRED EMBODIMENTS

Figure 3:
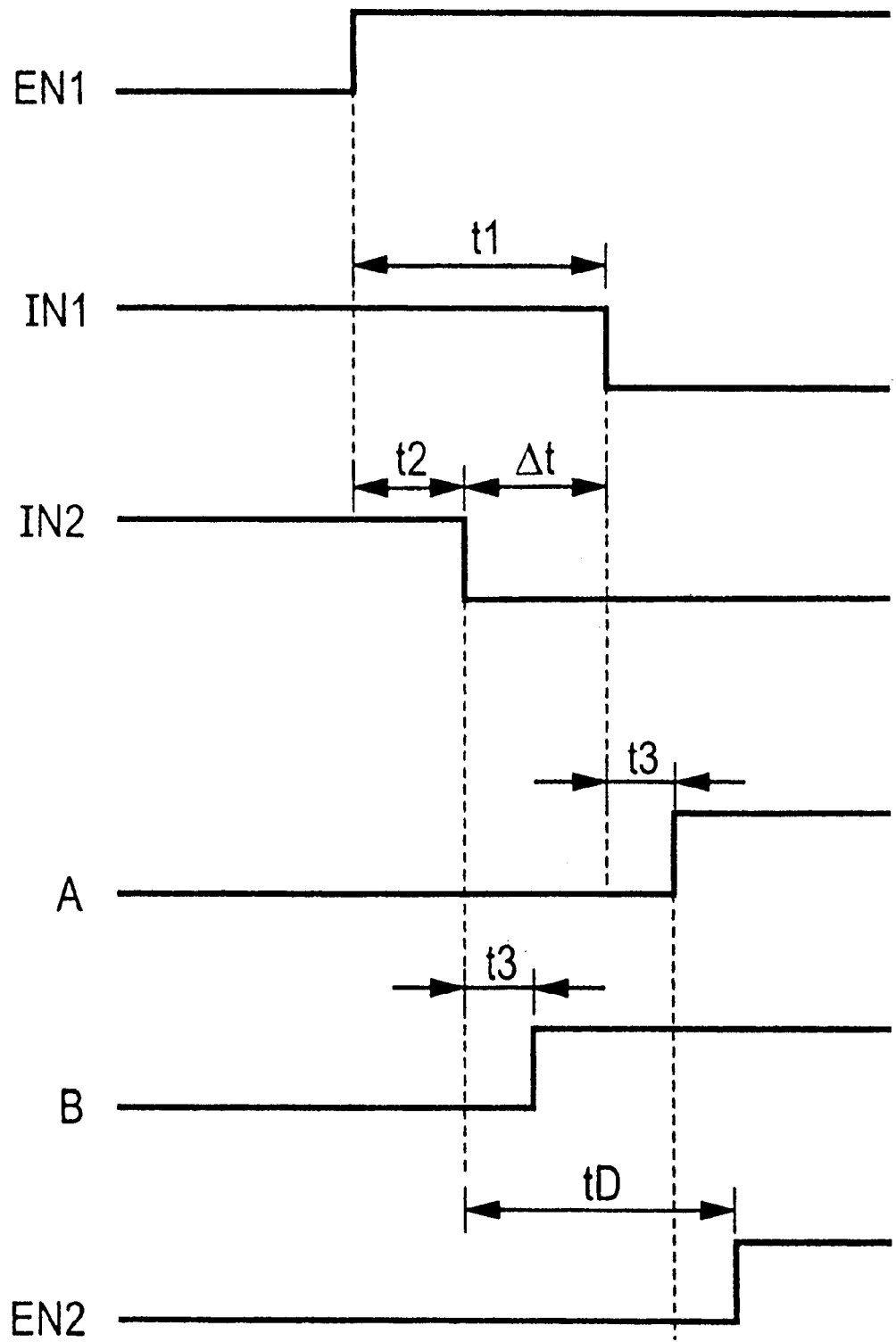
FIG. 3 is a timing graph showing exemplary signal delays by the components illustrated in FIG. 2.

Referring now to the figures of the drawing in detail and first, particularly, to FIG. 1 thereof, there is seen an integrated circuit having a first logic unit having an activation input EN1 and two outputs OUT1, OUT2. The integrated circuit furthermore has a second logic unit L2 having two inputs IN1, IN2, an activation input EN2 and also three outputs OUTX, OUTY, OUTZ. The outputs OUT1, OUT2 of the first logic unit L2 are connected to a respective one of the inputs IN1, IN2 of the second logic unit L2 via a respective signal line S1, S2. Furthermore, the integrated circuit has a delay unit D, having two inputs connected to a respective one of the signal lines S1, S2, and having an output connected to the activation input EN2 of the second logic unit L2.

The circuit illustrated in FIG. 1 operates as follows:

Signals which are transferred from the first logic unit L1 to the second logic unit L2 have different propagation times depending on the respective signal line S1, S2. This is due for example to different lengths of the signal lines S1, S2 or another different capacitive load on the two signal lines. If the first logic unit L1 is deactivated via its activation input, it outputs a first potential level, a high level in the exemplary embodiment under consideration here, at each of its two outputs OUT1, OUT2. If the first logic unit L1 is activated, it outputs a second potential level, a low level in this case, on at least one of its outputs OUT1, OUT2. The change in the signal levels on the two signal lines S1, S2 likewise effects a level change at at least one of the outputs OUTX, OUTY, OUTZ of the second logic unit L2, but only if the second logic unit L2 is activated via its activation input EN2. If, on the other hand, the second logic unit is deactivated, level changes at its inputs IN1, IN2 have no effect on its output signals.

The delay unit D ensures that after the activation of the first logic unit, level changes resulting at more than one output of the second logic unit L2 take place simultaneously, with the result that circuit units of the integrated circuit which are connected downstream of the second logic unit L2 on the output side and are not illustrated in FIG. 1 have these level changes communicated to them simultaneously. For this purpose, the delay unit D deactivates the second logic unit L2 via its output, provided that the first potential level is present at its two inputs. The delay unit D activates the second logic unit L2, provided that the second potential level is present at at least one of the inputs of the delay unit. In this case, the delay unit D triggers a temporally delayed level change at its output on account of a level change at one of its inputs from the high to the low level, the delay by the delay unit being at least as long as the difference between the signal propagation times on the two signal lines S1, S2.

FIG. 2 shows a detailed circuit diagram of the integrated circuit from FIG. 1. The functioning of the circuit will be explained in more detail with reference to FIG. 2. The first logic unit L1 has a first NAND gate N1, whose first input is connected to an input signal E1 and whose second input is connected to the activation input EN1 of the first logic unit L1. In addition, it has a second NAND gate N2, whose first input is connected to a second input signal E2 and whose second input is likewise connected to the activation input EN1. An output of the first NAND gate N1 is the first output OUT1 and an output of the second NAND gate N2 is the second output OUT2 of the first logic unit L1.

The second logic unit L2 has a first AND gate A1, whose first input is connected to the first input IN1, whose second input is connected to the activation input EN2 and whose output is connected to the first output OUTX of the second logic unit L2. Furthermore, the second logic unit L2 has a second AND gate A2, whose first input is connected to the second input IN2 and whose second input is connected to the activation input EN2 and whose output is connected to the second output OUTY of the second logic unit L2. The second logic unit furthermore has a first inverter I1, whose input is connected to the first input IN1 of the second logic unit L2. It additionally has a second inverter I2, whose input is connected to the second input IN2 of the second logic unit L2. Furthermore, it has a third AND gate A3, whose first input is connected to the output A of the first inverter I1, whose second input is connected to the output B of the second inverter I2 and whose third input is connected to the activation input EN2 of the second logic unit L2. An output of the third AND gate A3 is connected to the third output OUTZ of the second logic unit L2. The delay unit D in FIG. 2 has a third NAND gate N3, whose inputs are connected to a respective one of the signal lines S1, S2 and whose output is connected to the activation input EN2 of the second logic unit L2.

The first logic unit L1 is deactivated if a low level is present at its activation input EN1. A high level is then produced at its two outputs OUT1, OUT2. If the high level is present at the two inputs of the delay unit D, it outputs a low level at its output, as a result of which the second logic unit L2 is deactivated. Since the low level at the activation input EN2 is fed to all three AND gates A1, A2, A3, the second logic unit L2 in each case outputs a low level at its three outputs OUTX, OUTY, OUTZ in the deactivated state. The delay unit D therefore ensures that the second logic unit L2 is deactivated if the first logic unit L1 is deactivated. The second logic unit L2 then has defined levels, low levels in the present case, at each of its outputs, just like the first logic unit L1.

As soon as the first logic unit L1 is activated via its activation input EN1 by a high level being generated at the latter, a level which is the inverse of the level of the input signals E1, E2 is established at the outputs OUT1, OUT2 of the first logic unit L1. The resulting level changes at the outputs OUT1, OUT2 of the first logic unit L1 propagate via the signal lines S1, S2 to the inputs IN1, IN2 of the second logic unit L2. In FIGS. 1 and 2, the signal lines S1, S2 have been illustrated only partially, since in reality they have a much greater length than the remaining connecting lines illustrated in the figures. On account of the different signal propagation times on the two signal lines S1, S2, level changes at the outputs OUT1, OUT2 of the first logic unit L1 become apparent at the inputs IN1, IN2 of the second logic unit L2 at different points in time. Without the delay unit D and the delayed activation of the second logic unit L2 that is carried out by the delay unit and is described below, these would trigger level changes at a plurality of the outputs OUTX, OUTY, OUTZ of the second logic unit L2 which would not take place at the same time. The delay unit D ensures that the second logic unit L2 is deactivated, and the signals present at its inputs IN1, IN2 are thus evaluated, only when the level being newly established after the activation of the first logic unit L1 on that signal line having the longer signal propagation time has been reliably established at the corresponding input IN1, IN2 of the second logic unit L2.

In this exemplary embodiment, the first NAND gate N1 and the second NAND gate N2, the three AND gates A1, A2 and A3 and the first inverter I1 and the second inverter I2 each have corresponding switching times. The switching time of the third NAND gate N3 and thus the delay by the delay unit D are chosen such that they are greater than the propagation time difference between the two signal lines S1 and S2 plus the switching time of the inverters I1, I2. The delay unit D therefore effects activation of the second logic unit L2 only when the levels which depend on the level of the input signals E1, E2 have already been reliably established at all the inputs of the AND gates A1, A2, A3 after the activation of the first logic unit L1.

The inputs of the delay unit D in FIGS. 1 and 2 are connected to the signal lines S1, S2 in the region of the inputs IN1 and IN2 of the second logic unit L2. This means that the delay by the delay unit D does not have to simulate the entire propagation time of the slower of the two signal lines S1, S2, as would be the case if the inputs of the delay unit D were connected directly to the outputs OUT1, OUT2 of the first logic unit L1, but rather only the propagation time difference between the two signal lines plus the switching time of the inverters I1, I2.

FIG. 3 shows a number of signal profiles for the purpose of illustrating the different delay times within the circuit of FIG. 2. In this case, it is assumed that the two input signals E1, E2 have a high level. The activation signal EN1 of the first logic unit L1 initially has a low level. The first logic unit L1 is consequently deactivated and its outputs OUT1, OUT2 have (since they are independent of the input signals E1, E2) a high level, which is also established, with a time delay, at the inputs IN1, IN2 of the second logic unit L2. A low level is established at the outputs A, B of the two inverters I1, I2, and likewise at the activation input EN2 of the second logic unit L2. A positive edge of the activation signal EN1 of the first logic unit L1 effects delayed level changes at the inputs IN1, IN2 of the second logic unit L2 on account of the signal propagation times on the two signal lines S1, S2. In this case, the first signal line S1 has a longer signal propagation time t1 than the signal propagation time t2 of the second signal line S2. The difference Δt between the two signal propagation times t1, t2 is likewise illustrated in FIG. 3. The output signals A, B of the two inverters I1, I2 likewise have a level change only after a switching time t3, which follows the respective level change at the input IN1, IN2 of the second logic unit L2. The delay time tD of the delay unit D is greater than the sum of the propagation time difference Δt and the switching time t3 of the inverters I1, I2. After the negative edge has occurred at the second input IN2 of the second logic unit L2, only after the delay time tD does the delay unit D effect a positive change of the second activation signal EN2, as a result of which the second logic unit L2 is activated. The delay time tD of the delay unit D corresponds to the switching time of its third NAND gate N3.

Figure 4:
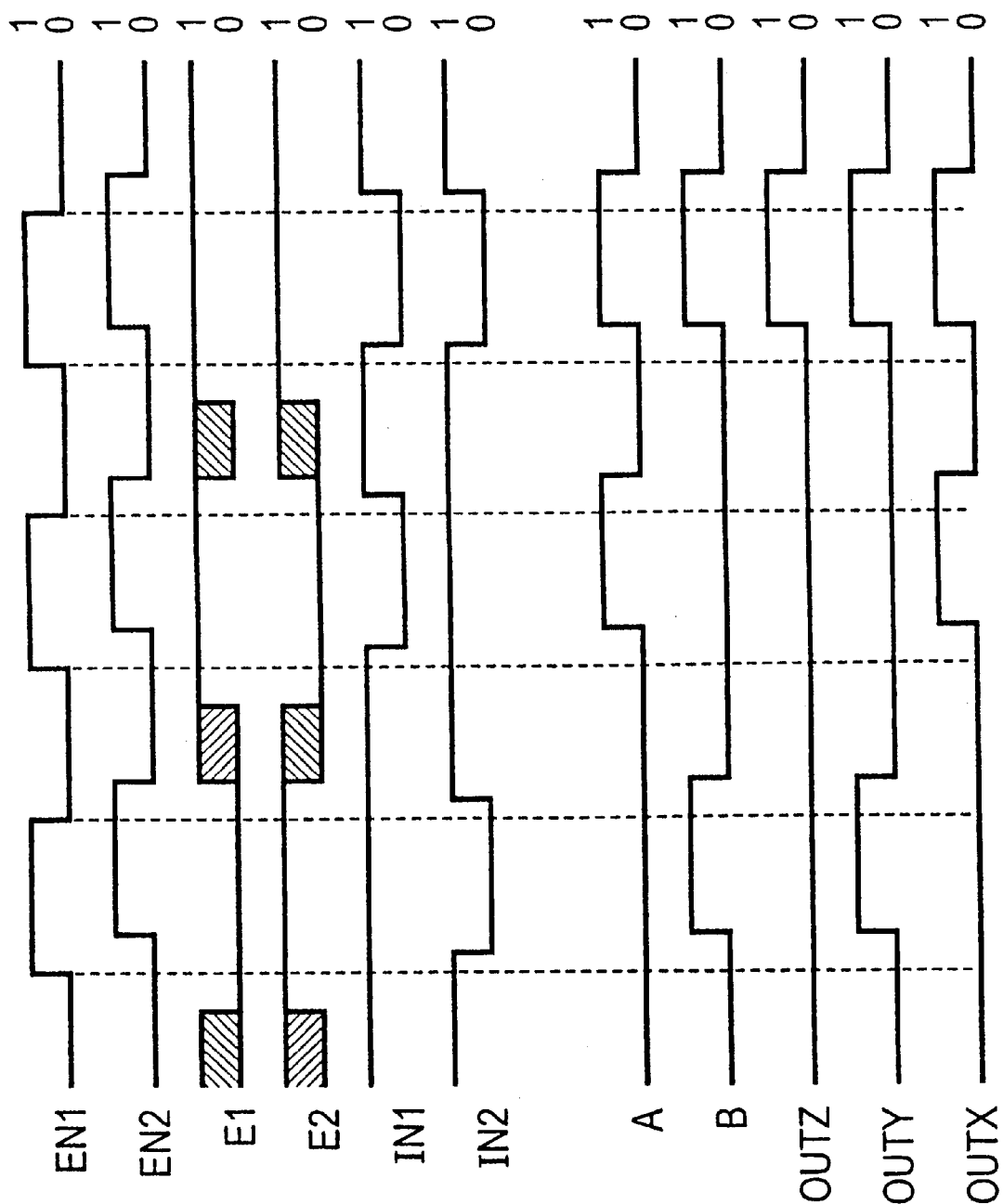
FIG. 4 is a graph showing profiles of the signals illustrated in FIG. 2.

FIG. 4 shows a plurality of activation and deactivation cycles of the circuit of FIG. 2 with the corresponding signal profiles. An "assessment" of the levels of the input signals E1, E2 only ever takes place at a high level of the first activation signal EN1. FIG. 4 shows three successive active cycles in which the first activation signal EN1 has a high level in each case. In the third activation cycle in FIG. 4, the two input signals E1, E2 have a high level. FIG. 4 reveals that level changes thereupon occur simultaneously at the three outputs OUTX, OUTY, OUTZ of the second logic unit L2. This simultaneity of level changes at a plurality of the outputs of the second logic unit is effected by the delay unit D.

I claim:

1. An integrated circuit, comprising:

a first logic unit having an activation input, a first output, and a second output;

a second logic unit having a first input, a second input, and an activation input;

a delay unit having a first input, a second input, and an output connected to said activation input of said second logic unit;

a first signal line having a first end and a second end and a length therebetween such that a propagation delay occurs for a signal transmitted between said first end and said second end, said first end of said first signal line connected to said first output of said first logic unit and said second end of said first signal line connected to said first input of said second logic unit, said first signal line having a location adjacent said second end of said first signal line, said first input of said delay unit connected to said location adjacent said second end of said first signal line;

a second signal line having a first end and a second end and a length therebetween such that a propagation delay occurs for a signal transmitted between said first end of said second signal line and said second end of said second signal line, said first end of said second signal line connected to said second output of said first logic unit and said second end of said second signal line connected to said second input of said second logic unit, said second signal line having a location adjacent said second end of said second signal line, said second input of said delay unit connected to said location adjacent said second end of said second signal line;

said first logic unit, in a deactivated state thereof, outputting a first potential level at said first output thereof and at said second output thereof, said first logic unit, in an activated state thereof, outputting a second potential on at least one of said first output thereof and said second output thereof and a second potential level on at least one of said two outputs in an activated state thereof;

said second logic unit having at least two outputs generating, upon being activated, a level change on account of a level change at one of said first input thereof and said second input thereof; said delay unit deactivating said second logic unit via said output of said delay unit when the first potential level is present at said first input thereof and at said second input thereof, and activating said second logic unit when the second potential level is present at one of said first input thereof and said second input thereof;

said delay unit triggering a level change having a temporal delay at said output thereof on account of a level change at one of said first input thereof and said second input thereof, said delay being at least as long as a difference between a signal propagation time from said first end of said first signal line to said second end of said first signal line and a signal propagation time from said first end of said second signal line to said second end of said second signal line.

* * * * *